(12) United States Patent
Lakshminarayanan et al.

(10) Patent No.: US 8,542,514 B1
(45) Date of Patent: Sep. 24, 2013

(54) MEMORY STRUCTURE HAVING SRAM CELLS AND SONOS DEVICES

(75) Inventors: Sethuraman Lakshminarayanan, San Jose, CA (US); Myongseob Kim, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 632 days.

(21) Appl. No.: 12/242,285

(22) Filed: Sep. 30, 2008

(51) Int. Cl.
*G11C 5/06* (2006.01)

(52) U.S. Cl.
USPC .... 365/63; 365/49.11; 365/49.16; 365/49.17; 365/67; 365/68; 365/70; 365/72; 365/185.33; 257/324; 257/798; 257/903; 257/E27.098; 257/E39.309

(58) Field of Classification Search
CPC ........ G11C 5/063; G11C 8/08; G11C 11/405; G11C 16/0483; G11C 11/412; H01L 27/0207; H01L 27/105; H01L 27/11; H01L 27/1104; H01L 27/115; H01L 27/11568; H01L 21/28282; H01L 27/11521
USPC .............. 365/70, 68, 67, 72, 49.11, E27.098, 365/63, 185.33, 49.16, 49.17; 257/324, 798, 257/903, E29.309, E27.098
See application file for complete search history.

(56) References Cited

U.S. PATENT DOCUMENTS

| | | | |
|---|---|---|---|
| 7,126,837 B1 | 10/2006 | Banachowicz et al. | |
| 7,277,309 B1 | 10/2007 | Banachowicz et al. | |
| 2006/0023503 A1* | 2/2006 | Lee | 365/185.05 |
| 2006/0193174 A1* | 8/2006 | Choi et al. | 365/185.08 |
| 2008/0153298 A1* | 6/2008 | Hui et al. | 438/703 |
| 2009/0147578 A1* | 6/2009 | Scade et al. | 365/185.08 |

OTHER PUBLICATIONS

Simtek, "nvSRAM Basics," http://www.simtek.com/attachments/AppNote01.pdf, pp. 1-6.
Simtek, "The Simtek nonvolatile SRAM," http://www.simtek.com/product-information/SimtekCurrentProducts.pdf, 6 pgs.

* cited by examiner

*Primary Examiner* — Matthew E Warren
*Assistant Examiner* — David Chen

(57) ABSTRACT

A memory structure and method to fabricate the same is described. The memory structure includes a first memory cell having a first pair of non-volatile portions. The memory structure also includes a second memory cell having a second pair of non-volatile portions. The first and second pairs of non-volatile portions are disposed in an inter-locking arrangement.

10 Claims, 7 Drawing Sheets

MEMORY STRUCTURE HAVING SRAM CELLS AND SONOS DEVICES

TECHNICAL FIELD

Embodiments of the invention are in the field of semiconductor devices and, in particular, memory structures and methods to fabricate memory structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. Optimization of the performance of each device becomes increasingly significant. Furthermore, space constraint considerations may also impact efficiency with respect to the real estate of semiconductor die.

DETAILED DESCRIPTION

A memory structure and a method to fabricate a memory structure are described herein. In the following description, numerous specific details are set forth, such as specific dimensions, in order to provide a thorough understanding of embodiments of the present invention. It will be apparent to one skilled in the art that embodiments of the present invention may be practiced without these specific details. In other instances, well-known processing operations, such as patterning operations, are not described in detail in order to not unnecessarily obscure embodiments of the present invention. Furthermore, it is to be understood that the various embodiments shown in the Figures are illustrative representations and are not necessarily drawn to scale.

Disclosed herein are a memory structure and a method to fabricate the same. The memory structure may include a first memory cell having a first pair of non-volatile portions. In one embodiment, the memory structure also includes a second memory cell having a second pair of non-volatile portions. The first and second pairs of non-volatile portions are disposed in an inter-locking arrangement. A method for fabricating a memory structure may include forming a first memory cell having a first pair of non-volatile portions. In one embodiment, a second memory cell is formed to have a second pair of non-volatile portions, wherein the first and second pairs of non-volatile portions are formed in an inter-locking arrangement.

A memory structure having first and second pairs of non-volatile portions of first and second memory cells, respectively, formed in an inter-locking arrangement may reduce the area used by the cell in a cell array layout scheme. For example, in accordance with an embodiment of the present invention, a stand-alone memory cell would otherwise have an area of approximately 1.6 microns by approximately 1.3 microns to consume an area of approximately 2.1 square microns. Thus, two stand-alone memory cells would otherwise have an area of approximately 4.2 square microns. Instead, in one embodiment, two memory cells having an inter-locking arrangement reduce the area used by the cell in a cell array layout to an area of approximately 2.5 microns by approximately 1.4 microns to consume an area of approximately 3.5 square microns. In a specific embodiment, the non-volatile portions of such first and second memory cells include 65 nanometer node SONOS-type devices.

Figure 1:
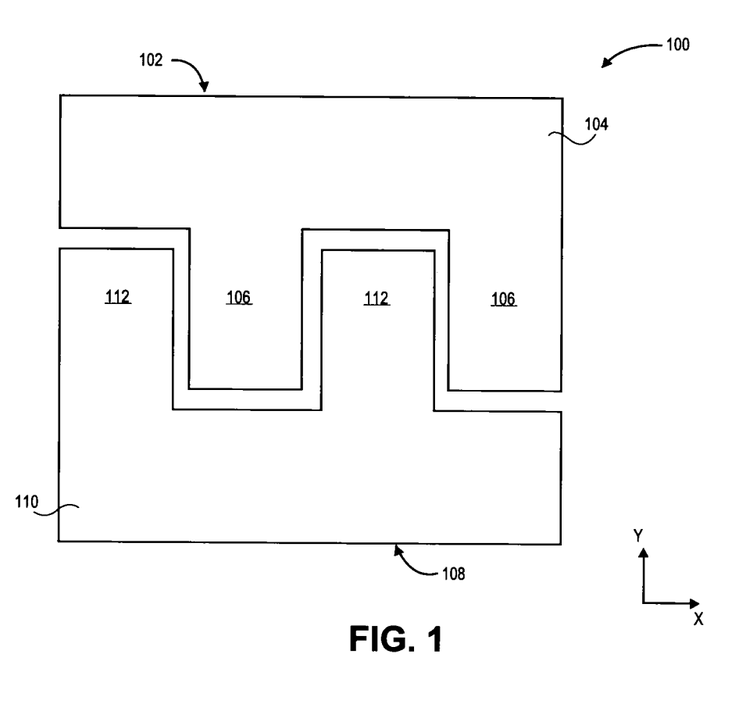
FIG. 1 illustrates a block diagram of a memory structure, in accordance with an embodiment of the present invention.
Figure 2:
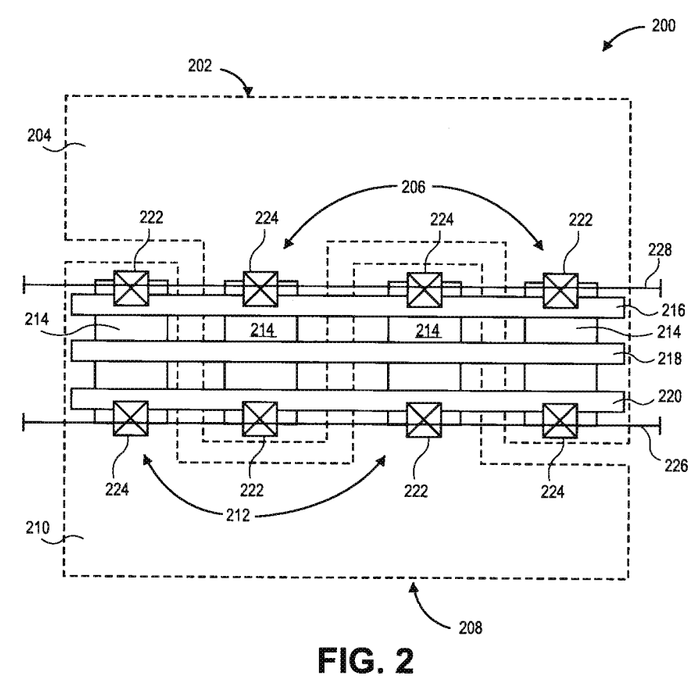
FIG. 2 illustrates a block diagram of a memory structure, including detailed aspects of the non-volatile portions of the memory structure, in accordance with an embodiment of the present invention.

A memory structure may include first and second pairs of non-volatile portions of first and second memory cells, respectively. FIG. 1 illustrates a block diagram of a memory structure, in accordance with an embodiment of the present invention. FIG. 2 illustrates a block diagram of a memory structure, including detailed aspects of the non-volatile portions of the memory structure, in accordance with an embodiment of the present invention.

Referring to FIG. 1, a memory structure 100 includes a first memory cell 102 having a first pair of non-volatile portions 106. Memory structure 100 also includes a second memory cell 108 having a second pair of non-volatile portions 112. In accordance with an embodiment of the present invention, the first pair of non-volatile portions 106 and the second pair of non-volatile portions 112 are disposed in an inter-locking arrangement, as depicted in FIG. 1. In an embodiment, first memory cell 102 and second memory cell 108 further include first and second static random access memory (SRAM) portions 104 and 110, respectively, coupled with the non-volatile portions 106 and 112, respectively, as is also depicted in FIG. 1.

In accordance with an embodiment of the present invention, the first and second pairs of non-volatile portions 106 and 112, respectively, include SONOS-type devices. In one embodiment, the SONOS-type devices are 65 nanometer node devices. In an alternative embodiment, the first and second pairs of non-volatile portions 106 and 112, respectively, include flash-type devices which utilize a floating gate architecture. In accordance with another embodiment of the present invention, each of the first and second SRAM portions 104 and 110, respectively, includes a 6-T SRAM portion. In an embodiment, the total area of the first and second memory cells 102 and 108 combined is approximately 2.5 microns (along the Y-axis of FIG. 1) by approximately 1.4 microns (along the X-axis of FIG. 1).

Referring to FIG. 2, memory structure 200 includes a first memory cell 202 having a first pair of non-volatile portions 206. Memory structure 200 also includes a second memory cell 208 having a second pair of non-volatile portions 212. In accordance with an embodiment of the present invention, the first pair of non-volatile portions 206 and the second pair of non-volatile portions 212 are disposed in an inter-locking arrangement, as depicted in FIG. 2. In an embodiment, first memory cell 202 and second memory cell 208 further include first and second SRAM portions 204 and 210, respectively, coupled with the non-volatile portions 206 and 212, respectively, as is also depicted in FIG. 2. First and second memory cells 202 and 208, first and second pairs of non-volatile portions 206 and 212 and first and second SRAM portions 204 and 210 may have characteristics and features similar to those of first and second memory cells 102 and 108, first and second pairs of non-volatile portions 106 and 112 and first and second SRAM portions 104 and 110, respectively, described in association with FIG. 1.

In accordance with an embodiment of the present invention, memory structure 200 further includes three gate lines 216, 218 and 220, each gate line overlapping diffusion areas 214 of both the first and second pairs of non-volatile portions 206 and 212 (to form a shared "tri-gate" structure), as depicted in FIG. 2. In one embodiment, the first gate line 216 is a "store" gate line, the second gate line 218 is "non-volatile gate" gate line, and the third gate line 220 is a "recall" gate line. Referring again to FIG. 2, in an embodiment, memory structure 200 includes a set of interconnects including interconnects 222 and 226 coupled with the first and second pairs of non-volatile portions 206 and 212. In one embodiment, interconnects 222 are "metal 2" interconnects and interconnect 226 is a "metal 3" power supply line for gate lines 216, 218 and 220. In accordance with another embodiment of the present invention, memory structure 200 further includes, in addition to interconnects 222 and 226, a set of dummy interconnects including dummy interconnects 224 and 228 coupled with the first and second pairs of non-volatile portions 206 and 212, as depicted in FIG. 2. In one embodiment, dummy interconnects 224 are dummy "metal 2" interconnects and interconnect 226 is a dummy "metal 3" line. In an embodiment, the set of dummy interconnects is provided for increasing the physical symmetry of the inter-locking combination of first and second memory cells 202 and 208. In another embodiment, the set of dummy interconnects is provided for increasing the electrical symmetry of the inter-locking combination of first and second memory cells 202 and 208. Such an increase in electrical symmetry may reduce time delay otherwise associated with capacitance differences that may occur in electrically asymmetric configurations. In an alternative embodiment, not depicted, the set of dummy interconnects is provided for decreasing the physical symmetry, yet increasing the electrical symmetry, of the inter-locking combination of first and second memory cells 202 and 208.

Figure 3:
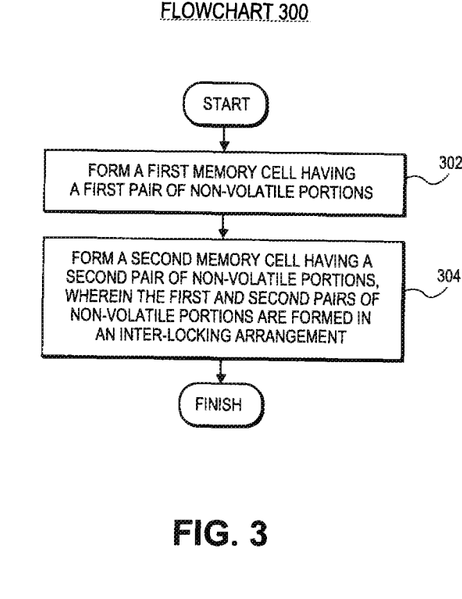
FIG. 3 is a Flowchart representing operations in a method for fabricating a memory structure, in accordance with an embodiment of the present invention.

A method for fabricating a memory structure may include fabricating first and second pairs of non-volatile portions of first and second memory cells, respectively. FIG. 3 is a Flowchart 300 representing operations in a method for fabricating a memory structure, in accordance with an embodiment of the present invention.

Referring to operation 302 of Flowchart 300, in an embodiment, a method for fabricating a memory structure includes forming a first memory cell having a first pair of non-volatile portions. Referring to operation 304 of Flowchart 300, in an embodiment, the method further includes forming a second memory cell having a second pair of non-volatile portions, wherein the first and second pairs of non-volatile portions are formed in an inter-locking arrangement.

In accordance with an embodiment of the present invention, forming the first and second pairs of non-volatile portions includes forming SONOS-type devices. In one embodiment, forming the SONOS-type devices includes forming 65 nanometer node devices. In an alternative embodiment, forming the first and second pairs of non-volatile portions includes forming flash-type devices which utilize a floating gate architecture. In accordance with another embodiment of the present invention, forming the first and second memory cells further includes forming SRAM portions coupled with the non-volatile portions. In one embodiment, forming the SRAM portion of each memory cell includes forming a 6-T SRAM portion. In an embodiment, a method for fabricating a memory structure further includes forming three gate lines, each gate line overlapping diffusion areas of both the first and second pairs of non-volatile portions. In an embodiment, a method for fabricating a memory structure further includes forming a set of dummy interconnects coupled with the first and second pairs of non-volatile portions. In one embodiment, forming the set of dummy interconnects includes increasing the physical symmetry of the inter-locking combination of the first and second memory cells. In another embodiment, forming the set of dummy interconnects includes increasing the electrical symmetry of the inter-locking combination of the first and second memory cells. In an alternative embodiment, forming the set of dummy interconnects includes decreasing the physical symmetry, yet increasing the electrical symmetry, of the inter-locking combination of the first and second memory cells. In an embodiment, forming the first and second memory cells includes forming the first and second memory cells to have a total area of approximately 2.5 by approximately 1.4 square microns.

Figure 4:
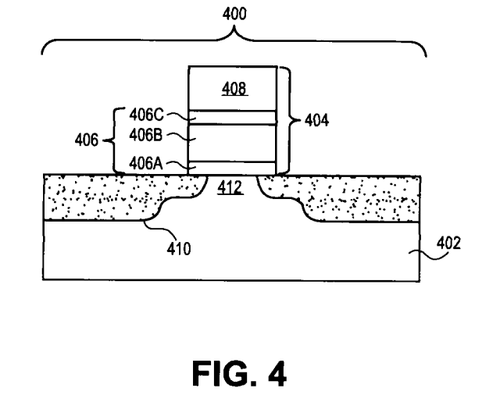
FIG. 4 illustrates a cross-sectional view of a SONOS-type memory device, in accordance with an embodiment of the present invention.

As described above, the non-volatile portions of memory cells in a memory structure having an inter-locking arrangement may include SONOS-type memory devices. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the blocking dielectric layer and the second "Semiconductor" refers to the gate layer. A SONOS-type device, however, is not limited to these specific materials, as described below. FIG. 4 illustrates a cross-sectional view of a SONOS-type memory device, in accordance with an embodiment of the present invention.

Referring to FIG. 4, a SONOS-type memory device 400 includes a substrate 402. A SONOS-type gate stack 404 including an ONO portion 406 is disposed on substrate 402. SONOS-type memory device 400 further includes source and drain regions 410 on either side of SONOS-type gate stack 404 to define a channel region 412. SONOS-type gate stack 404 includes a gate layer 408 disposed above ONO portion 406. Gate layer 408 is electrically isolated from substrate 402 by ONO portion 406. ONO portion 406 includes a tunnel dielectric layer 406A, a charge-trapping layer 406B and a blocking dielectric layer 406C, overlying charge-trapping layer 406B.

Substrate 402 and, hence, channel region 412, may be composed of any material suitable for semiconductor device fabrication. In one embodiment, substrate 402 is a bulk substrate composed of a single crystal of a material which may include, but is not limited to, silicon, germanium, silicon-germanium or a III-V compound semiconductor material. In another embodiment, substrate 402 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 402 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 402 and, hence, channel region 412, may include dopant impurity atoms. In a specific embodiment, channel region 412 is doped P-type and, in an alternative embodiment, channel region 412 is doped N-type.

Source and drain regions 410 in substrate 402 may be any regions having opposite conductivity to channel region 412. For example, in accordance with an embodiment of the present invention, source and drain regions 410 are N-type doped regions while channel region 412 is a P-type doped region. In one embodiment, substrate 402 and, hence, channel region 412 are composed of boron-doped single-crystal silicon having a boron concentration approximately in the range of $1\times10^{15}$-$1\times10^{19}$ atoms/cm$^3$. Source and drain regions 410 are composed of phosphorous- or arsenic-doped regions having a concentration of N-type dopants approximately in the range of $5\times10^{16}$-$5\times10^{19}$ atoms/cm$^3$. In a specific embodiment, source and drain regions 410 have a depth in substrate 402 approximately in the range of 80-200 nanometers. In accordance with an alternative embodiment of the present invention, source and drain regions 410 are P-type doped regions while channel region 412 is an N-type doped region.

Tunnel dielectric layer 406A may be composed of any material and have any thickness suitable to allow charge carriers to tunnel into the charge-trapping layer under an applied gate bias, while maintaining a suitable barrier to leakage when the device is unbiased. In one embodiment, tunnel dielectric layer 406A is formed by a thermal oxidation process and is composed of silicon dioxide or silicon oxy-nitride, or a combination thereof. In another embodiment, tunnel dielectric layer 406A is formed by chemical vapor deposition or atomic layer deposition and is composed of a dielectric layer which may include, but is not limited to, silicon nitride, aluminum oxide, hafnium oxide, zirconium oxide, hafnium silicate, zirconium silicate, hafnium oxy-nitride, hafnium zirconium oxide or lanthanum oxide. In another embodiment, tunnel dielectric layer 406A is a bi-layer dielectric region including a bottom layer of a material such as, but not limited to, silicon dioxide or silicon oxy-nitride and a top layer of a material which may include, but is not limited to, silicon nitride, aluminum oxide, hafnium oxide, zirconium oxide, hafnium silicate, zirconium silicate, hafnium oxy-nitride, hafnium zirconium oxide or lanthanum oxide. Thus, in one embodiment, tunnel dielectric layer 406A includes a high-K dielectric portion. In a specific embodiment, tunnel dielectric layer 406A has a thickness approximately in the range of 1-10 nanometers.

Charge-trapping layer 406B may be composed of any material and have any thickness suitable to store charge and, hence, raise the threshold voltage of gate stack 404. In accordance with an embodiment of the present invention, charge-trapping layer 406B is formed by a chemical vapor deposition process and is composed of a dielectric material which may include, but is not limited to, stoichiometric silicon nitride, silicon-rich silicon nitride or silicon oxy-nitride. In one embodiment, charge-trapping layer 406B is composed of a bi-layer silicon oxy-nitride region. For example, in a specific embodiment, charge-trapping layer 406B includes an oxygen-rich portion and a silicon-rich portion and is formed by depositing an oxygen-rich oxy-nitride film by a first composition of gases and, subsequently, depositing a silicon-rich oxy-nitride film by a second composition of gases. In a particular embodiment, charge-trapping layer 406B is formed by modifying the flow rate of ammonia ($NH_3$) gas, and introducing nitrous oxide ($N_2O$) and dichlorosilane ($SiH_2Cl_2$) to provide the appropriate gas ratios to yield first an oxygen-rich oxy-nitride film and then a silicon-rich oxy-nitride film. In one embodiment, charge-trapping layer 406B has a thickness approximately in the range of 5-10 nanometers. In accordance with an alternative embodiment of the present invention, charge-trapping layer 406B has a graded composition.

Blocking dielectric layer 406C may be composed of any material and have any thickness suitable to maintain a barrier to charge leakage without significantly decreasing the capacitance of gate stack 404. In one embodiment, blocking dielectric layer 406C is formed by a chemical vapor deposition process and is composed of silicon dioxide, silicon oxy-nitride, silicon nitride, or a combination thereof. In another embodiment, blocking dielectric layer 406C is formed by atomic layer deposition and is composed of a high-k dielectric layer which may include, but is not limited to, hafnium oxide, zirconium oxide, hafnium silicate, hafnium oxy-nitride, hafnium zirconium oxide or lanthanum oxide. In a specific embodiment, blocking dielectric layer 406C has a thickness approximately in the range of 1-20 nanometers.

Gate layer 408 may be composed of any conductor or semiconductor material suitable for accommodating a bias during operation of a SONOS-type transistor. In accordance with an embodiment of the present invention, gate layer 408 is formed by a chemical vapor deposition process and is composed of doped poly-crystalline silicon. In another embodiment, gate layer 408 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel. In one embodiment, gate layer 408 is a high work-function gate layer.

Figures 5A, 5C, 5D:
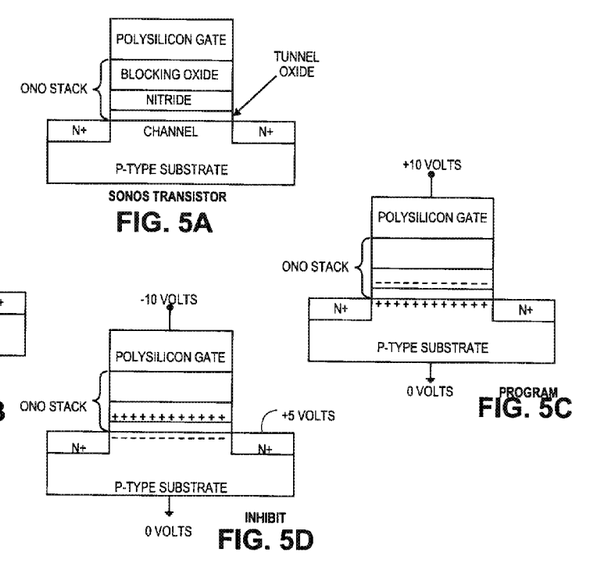
FIG. 5A illustrates the structure of a SONOS-type transistor, in accordance with an embodiment of the present invention.
FIG. 5C illustrates a SONOS-type program configuration, in accordance with an embodiment of the present invention.
FIG. 5D illustrates a SONOS-type inhibit configuration, in accordance with an embodiment of the present invention.

A SONOS-type memory device may be operated to provide a non-volatile memory device. FIG. 5A illustrates the cross-section of an exemplary SONOS-type transistor, based on an N-type, in accordance with an embodiment of the present invention. The SONOS-type transistor includes a P-type silicon substrate with N+ source and drain diffusions that define the limits of a channel region. Immediately above the channel is the tunnel oxide layer. Immediately above the tunnel oxide layer is a nitride layer approximately 100 nm thick. Immediately above the nitride layer is another oxide layer approximately 3 to 10 nm thick, known as the blocking oxide layer. Immediately above the blocking oxide layer is a control gate, such as a polysilicon gate.

Figure 5B:
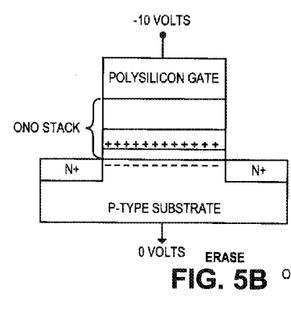
FIG. 5B illustrates a SONOS-type erase configuration, in accordance with an embodiment of the present invention.

An NSONOS-type memory cell may be programmed and erased using a quantum mechanical effect known as Modified Fowler-Nordheim tunneling. FIG. 5B illustrates how a SONOS-type memory cell is erased, in accordance with an embodiment of the present invention. A negative voltage (e.g., −10V) may be applied to the gate electrode. The resulting electric field between the gate and the substrate causes holes to tunnel from the substrate through the thin tunnel oxide layer where they are trapped in the nitride layer. When the erase voltage is removed, the holes that are trapped in the nitride layer attract electrons to the channel, which inverts the normally P-type channel. The inverted channel allows the transistor to conduct current between the drain and source in the presence of an applied voltage, even when the gate-to-source voltage is less than $V_T$. The device may be turned off by applying a negative gate-to-source voltage to repel electrons from the channel. In effect, the trapped holes lower the threshold voltage from the intrinsic threshold voltage $V_T$ to an erased threshold voltage $V_{TE}$. The state of the memory cell may be read by setting $V_{GS}$ to zero and applying a voltage (e.g., 1 volt) from drain to source and sensing the current that flows through the cell. If the current is greater than some predetermined value, then the cell may be recognized as erased. The erased state may be associated with a logic state (e.g., a logical "0").

FIG. 5C illustrates how a SONOS-type memory cell is programmed, in accordance with an embodiment of the present invention. A positive voltage (e.g., +10V) may be applied to the gate electrode. The resulting electric field between the gate and the substrate causes electrons to tunnel from the substrate through the thin tunnel oxide layer where they are trapped in the nitride layer. When the programming voltage is removed, the electrons that are trapped in the nitride layer repel electrons from the channel and induce a positive space charge in the P-type channel. The electron depleted channel forms P-N junctions with the N+ source and drain diffusions. In such a state, the transistor may not conduct current from drain to source in the presence of an applied drain-to-source voltage, even if $V_{GS}$ is at the intrinsic threshold voltage. This is because one of the P-N junctions may be reversed biased regardless of the polarity of the applied voltage. The device may be turned on by applying a gate-to-source voltage greater than $V_T$ to attract electrons to the channel. In effect, the electrons trapped in the nitride layer raise the threshold voltage from the intrinsic threshold voltage $V_T$ to a programmed threshold voltage $V_{TP}$. The state of the memory cell may be read by setting the gate-to-source voltage to zero and applying a voltage (e.g., 1 volt) from drain to source and sensing the current that flows through the cell. If the current is less than some predetermined maximum leakage value, then the cell may be recognized as programmed. The programmed state may be associated with a logic state (e.g., a logical "1").

Figure 6:
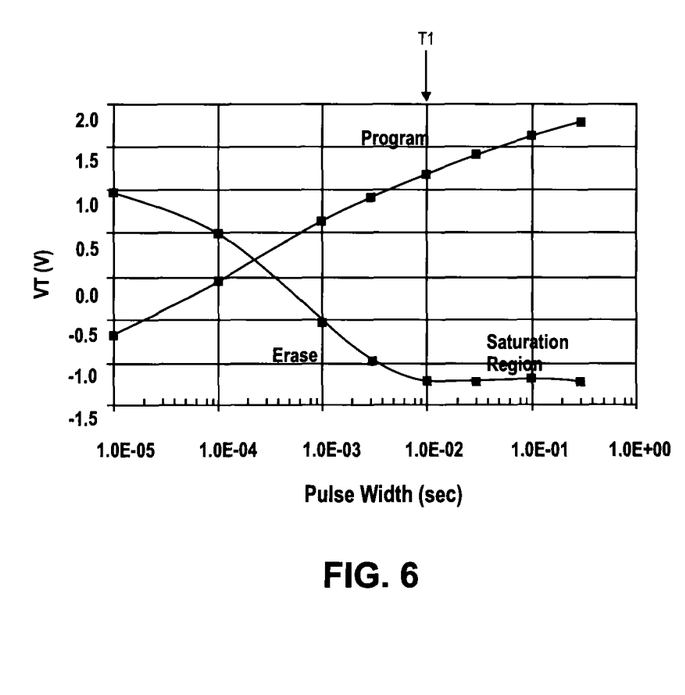
FIG. 6 illustrates SONOS-type threshold voltage transitions during program and erase operations, in accordance with an embodiment of the present invention.

The programming and erase operations are time dependent, with the duration of a program or erase pulse determining the amount of trapped charge that establishes the state of the cell. FIG. 6 illustrates how the threshold voltage of an exemplary SONOS-type memory device changes with time under an applied programming or erase voltage, in accordance with an embodiment of the present invention. As illustrated in FIG. 6, a programming pulse applied to an erased device raises the threshold voltage with time (as more electrons tunnel into the nitride layer), while an erase pulse applied to a programmed device lowers the threshold voltage (as more holes tunnel into the nitride layer). Typically, a pulse width of 10 ms may be used to program or erase the cell, as illustrated by T1 in FIG. 6.

Like some other types of memory (e.g., floating gate flash memory) SONOS-type memory may be controlled with a combination of row-select (e.g., word select) commands and/or operations and bit-select commands and/or operations. A write operation in SONOS-type memory typically includes a bulk erase (BE) operation followed by a program or inhibit operation. The bulk erase operation places all of the SONOS-type cells in a selected row in an erased ("0") state. Then, cells that are to be programmed (written to a "1" state) are exposed to a programming pulse, while cells that are to remain erased (written to a "0" state) are inhibited from programming. The inhibiting may be accomplished by applying an inhibiting voltage to those cells in the row that are to remain in the "0" or erased state. FIG. 5D illustrates a SONOS-type memory cell in an inhibit configuration, in accordance with an embodiment of the present invention. Referring to FIG. 5D, a positive voltage (e.g., +5V) may be applied to the drain of the SONOS-type transistor before the +10V programming pulse is applied. This positive voltage may reduce the electric field across the tunnel oxide when the programming pulse is applied, inhibiting electrons from tunneling through the tunnel oxide layer and changing the state of the cell. In practice, the inhibiting voltage may not be 100% effective, so that the threshold voltage of the inhibited cell undergoes a very small increase during the programming pulse, but not nearly enough to change the state of the cell.

Figure 7:
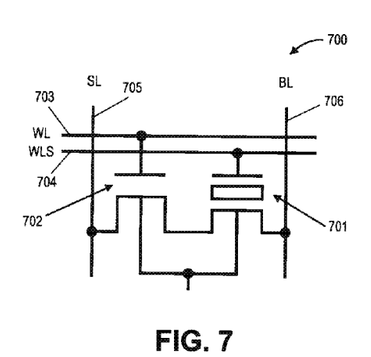
FIG. 7 illustrates a 2-transistor SONOS-type memory cell, in accordance with an embodiment of the present invention.

FIG. 7 illustrates a two-transistor (2T) SONOS-type memory cell 700, which includes a SONOS-type device 701 and a MOSFET pass transistor 702, in accordance with an embodiment of the present invention. The 2T SONOS-type memory cell may be part of a large array of similar cells in rows and columns. Each pass transistor in a row shares a common word line (WL) 703 and each SONOS-type device in a row shares a common SONOS-type word line (WLS) 704. Each pass transistor in a column shares a common source line (SL) 705 and each SONOS-type device in a column shares a common bit line (BL) 706. The SONOS-type word line (WLS) 704, connected to the gate of the SONOS-type device, may be used to program and erase the SONOS-type device. The word line (WL) 703 may be used to select the cell for a read operation as described above, where a read voltage may be impressed across the bit line (BL) 706 and the source line (SL) 705. Otherwise, the WL voltage may be held at zero volts to keep the pass transistor turned off. The source line (SL) 705 may be left floating during program and erase operations. The bit line (BL) 706 may be grounded for a program or erase operation or held at a positive voltage to inhibit the cell from programming as described above.

Figure 8:
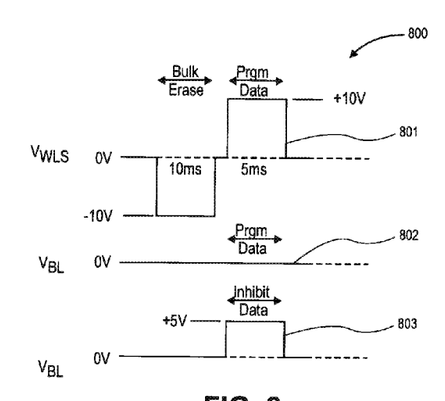
FIG. 8 illustrates 2-cycle SONOS-type programming, in accordance with an embodiment of the present invention.

FIG. 8 illustrates a waveform family 800 for a writing scheme for the memory cell of FIG. 7, in accordance with an embodiment of the present invention. Waveform 801 in FIG. 8 illustrates the voltage sequence ($V_{WLS}$) on the SONOS-type word line 704 and waveforms 802 and 803 illustrate the voltage on the bit line ($V_{BL}$) 706 for program and inhibit operations, respectively. As shown in FIG. 8, the bulk erase voltage pulse (−10 volts) may be applied for approximately 10 milliseconds and may be followed by a programming pulse (+10 volts) for approximately 5 milliseconds.

As described above, SRAM portions may be coupled with the non-volatile portions of each of the memory cells in a memory structure having an inter-locking arrangement. The SRAM portions may be composed of non-charge-storing semiconductor devices. In accordance with an embodiment of the present invention, the SRAM portions include metal-oxide-semiconductor field-effect transistor (MOS-FET) devices. In one embodiment, the MOS-FET is a device such as, but not limited to, a planar device, a non-planar device or a buried channel device.

Thus, a memory structure and method to fabricate the same have been disclosed. In accordance with an embodiment of the present invention, the memory structure includes a first memory cell having a first pair of non-volatile portions. The memory structure also includes a second memory cell having a second pair of non-volatile portions. The first and second pairs of non-volatile portions are disposed in an inter-locking arrangement. In one embodiment, the first and second pairs of non-volatile portions include SONOS-type devices. In another embodiment, the first and second memory cells further include SRAM portions coupled with the non-volatile portions.

What is claimed is:

1. A memory structure, comprising:
a first memory cell having a first plurality of non-volatile Semiconductor-Oxide-Nitride-Oxide-Semiconductor type (SONOS-type) devices coupled with a first Six Transistor (6-T) Static Random Access Memory (SRAM) cell;
a second memory cell having a second plurality of non-volatile SONOS-type devices coupled with a second 6-T SRAM cell, wherein the first plurality of non-volatile SONOS-type devices are interdigitated with the second plurality of non-volatile SONOS-type devices;
a store gate line, a non-volatile gate line, and a recall gate line, wherein the store gate line, the non-volatile gate line, and the recall gate line overlap diffusion areas of both the first and second pluralities of non-volatile SONOS-type devices; and
wherein each of the first and the second pluralities of non-volatile SONOS-type devices comprises an interconnect and a set of dummy interconnects.

2. The memory structure of claim 1, wherein the set of dummy interconnects is provided for increasing an electrical symmetry of the first and second memory cells by reducing a capacitance difference between the first and second memory cells.

3. The memory structure of claim 1, wherein the SONOS-type devices are 65 nanometer node devices.

4. The memory structure of claim 1, wherein the combination of the first and second memory cells has a total area, and wherein the total area of the first and second memory cells combined is approximately 2.5 by approximately 1.4 square microns.

5. The memory structure of claim 1, wherein alternating ones of the first plurality of non-volatile SONOS-type devices are interdigitated with corresponding alternating ones of the second plurality of non-volatile SONOS-type devices.

6. A method for fabricating a memory structure, comprising:
forming a first memory cell having a first plurality of non-volatile Semiconductor-Oxide-Nitride-Oxide-Semiconductor type (SONOS-type) devices coupled with a first Six Transistor (6-T) Static Random Access Memory (SRAM) cell;
forming a second memory cell having a second plurality of non-volatile SONOS-type devices coupled with a second 6-T SRAM cell, wherein the first plurality of non-volatile SONOS-type devices are interdigitated with the second plurality of non-volatile SONOS-type devices;
forming a store gate line, a non-volatile gate line, and a recall gate line, wherein each of the store gate line, the non-volatile gate line, and the recall gate line overlaps diffusion areas of both the first and second pluralities of non-volatile SONOS-type devices; and
forming a plurality of interconnects and a plurality of dummy interconnects, wherein each of the first and second pluralities of non-volatile SONOS-type devices is coupled with one of the plurality of interconnects and one of the plurality of dummy interconnects.

7. The method of claim 6, wherein forming the plurality of dummy interconnects comprises increasing an electrical symmetry of the first and second memory cells by reducing a capacitance difference between the first and second memory cells.

8. The method of claim 6, wherein forming the SONOS-type devices comprises forming 65 nanometer node devices.

9. The method of claim 6, wherein forming the first and second memory cells comprises forming the first and second memory cells to have a combined total area of approximately 2.5 by approximately 1.4 square microns.

10. The method of claim 6, wherein alternating ones of the first plurality of non-volatile SONOS-type devices are interdigitated with corresponding alternating ones of the second plurality of non-volatile SONOS-type devices.

* * * * *